United States Patent
Eom (10) Patent No.: US 9,390,957 B2
(45) Date of Patent: Jul. 12, 2016

(54) SUBSTRATE TRANSFER APPARATUS AND METHOD, AND SUBSTRATE PROCESSING APPARATUS

(71) Applicant: PSK INC., Hwaseong-si, Gyeonggi-do (KR)

(72) Inventor: Sanghee Eom, Hwaseong-si (KR)

(73) Assignee: PSK INC., Gyeonggi-Do (KR)

( * ) Notice: Subject to any disclaimer, the term of this patent is extended or adjusted under 35 U.S.C. 154(b) by 0 days.

(21) Appl. No.: 14/553,447

(22) Filed: Nov. 25, 2014

(65) Prior Publication Data

US 2015/0200122 A1 Jul. 16, 2015

(30) Foreign Application Priority Data

Jan. 13, 2014 (KR) ........................ 10-2014-0004124

(51) Int. Cl.
*H01L 21/00* (2006.01)
*H01L 21/683* (2006.01)
*H01L 21/677* (2006.01)

(52) U.S. Cl.
CPC ...... *H01L 21/6838* (2013.01); *H01L 21/67742* (2013.01)

(58) Field of Classification Search
CPC ...................... H01L 21/67742; H01L 21/6838
See application file for complete search history.

(56) References Cited

U.S. PATENT DOCUMENTS

| | | | | | |
|---|---|---|---|---|---|
| 5,951,833 | A * | 9/1999 | Yamagata | ............... | C25D 11/32 204/198 |
| 6,195,878 | B1 * | 3/2001 | Hata | .................. | H05K 13/0452 29/739 |
| 6,270,002 | B1 * | 8/2001 | Hayashi | ............... | B23K 3/0623 228/2.1 |
| 6,517,130 | B1 * | 2/2003 | Donoso | ................ | B25J 15/0616 294/185 |
| 6,588,043 | B1 * | 7/2003 | Frost | ................. | H01L 21/67034 15/77 |
| 8,523,510 | B2 * | 9/2013 | Snodgrass | ............ | B65G 49/061 414/222.01 |
| 2001/0008051 | A1 * | 7/2001 | Kato | ........................ | B01J 3/006 34/406 |
| 2002/0113039 | A1 * | 8/2002 | Mok | ................. | H01L 21/67051 216/92 |
| 2005/0006230 | A1 * | 1/2005 | Narushima | ....... | H01L 21/67017 204/298.2 |
| 2005/0102064 | A1 * | 5/2005 | Donoso | ............ | H01L 21/68707 700/254 |
| 2006/0102289 | A1 * | 5/2006 | Fukatsu | ............ | H01L 21/67051 156/345.55 |
| 2007/0067678 | A1 * | 3/2007 | Hosek | ................ | G05B 23/0235 714/25 |
| 2007/0233313 | A1 * | 10/2007 | Ikari | ................. | H01L 21/67028 700/213 |
| 2008/0017322 | A1 * | 1/2008 | Mitsumoto | ............. | B23B 38/18 156/538 |
| 2009/0065027 | A1 * | 3/2009 | Kawamura | ........ | H01L 21/02087 134/1.3 |
| 2009/0182454 | A1 * | 7/2009 | Donoso | .................. | B25J 9/1692 700/254 |

(Continued)

FOREIGN PATENT DOCUMENTS

| | | |
|---|---|---|
| JP | 2010-267668 | 11/2010 |
| KR | 10-2011-0007802 | 1/2011 |

OTHER PUBLICATIONS

Examination Report for KR Patent Application No. 10-2014-0004124 dated May 12, 2015, 6 pgs.

*Primary Examiner* — Jonathan L Sample
(74) *Attorney, Agent, or Firm* — Procopio, Cory, Hargreaves & Savitch LLP (57) ABSTRACT

Provided are a substrate transfer apparatus and method and a substrate processing apparatus. The substrate transfer apparatus includes: a body portion; an arm part coupled to the body portion, the arm part moving to allow the substrate to be transferred; a suction part provided with the arm portion, the suction part suctioning and fixing the substrate; and a control part controlling an operation of the substrate transfer apparatus, wherein the control part changes a suction point on the substrate to re-attempt suction when suction of the substrate by the suction part is unsuccessful.

20 Claims, 9 Drawing Sheets

(56) References Cited

U.S. PATENT DOCUMENTS

| | | | |
|---|---|---|---|
| 2009/0293265 A1* | 12/2009 | Inoue | H05K 13/08 29/739 |
| 2010/0102030 A1* | 4/2010 | Kondoh | H01L 21/67778 216/58 |
| 2010/0236405 A1* | 9/2010 | Yamawaku | H01L 21/67781 95/57 |
| 2012/0034570 A1* | 2/2012 | Yasui | F27B 17/0025 432/1 |
| 2012/0315113 A1* | 12/2012 | Hiroki | B65G 49/061 414/217 |
| 2013/0180448 A1* | 7/2013 | Sakaue | H01L 21/67739 118/696 |
| 2013/0189439 A1* | 7/2013 | Muffler | H01L 21/6838 427/425 |
| 2013/0200049 A1* | 8/2013 | Choi | B23K 26/043 219/121.61 |
| 2014/0004710 A1* | 1/2014 | Sakata | H01L 21/6719 438/758 |
| 2014/0052289 A1* | 2/2014 | Oowada | H01L 22/12 700/121 |
| 2014/0096379 A1* | 4/2014 | Saeki | H05K 13/0465 29/832 |

* cited by examiner

SUBSTRATE TRANSFER APPARATUS AND METHOD, AND SUBSTRATE PROCESSING APPARATUS

CROSS-REFERENCE TO RELATED APPLICATIONS

This U.S. non-provisional patent application claims priority under 35 U.S.C. §119 of Korean Patent Application No. 10-2014-0004124, filed on Jan. 13, 2014, the entire contents of which are hereby incorporated by reference.

BACKGROUND OF THE INVENTION

The present invention disclosed herein relates to a substrate transfer apparatus and method, and a substrate processing apparatus.

A robot is used which transfers a substrate in order to put the substrate in a process chamber for substrate processing, such as etching, ashing and cleaning and take a processed substrate out of the process chamber.

When transferring the substrate, methods of holding the substrate by the robot are roughly divided into an edge grip method and a vacuum suction method. According to the edge grip method, the robot grips the edge of the substrate to fix the substrate. According to the vacuum suction method, an arm of the robot includes a suction hole, and when the suction hole is in contact with the substrate and is closed, the substrate is fixed to the suction hole by the decrease of the internal pressure of a closed space.

When the substrate is supplied, a typical substrate transfer robot using the vacuum suction method attempts to suction the center of the substrate, and when suction is unsuccessful, the robot re-attempts to suction the center of the substrate that is the same point. When the suction of the substrate is unsuccessful even after the robot has attempted to suction a predetermined number of times, an apparatus for processing a substrate has set off the alarm to inform a worker that the supply of the substrate is unsuccessful and thus it is no longer possible to perform the process.

However, there is a limitation in that a typical substrate processing apparatus always sets off the alarm without consideration of each case to stop the process, even when it is difficult to suction the central part of the substrate because there is a foreign material on the center of the substrate or the central region of the substrate is bent, but it is possible to suction other regions of the substrate.

SUMMARY OF THE INVENTION

An embodiment of the present invention may lower the chance of a substrate processing process stopping and enhance productivity by increase the rate of success at which the substrate is suctioned.

Embodiments of the present invention provide substrate transfer apparatuses include: a body portion; an arm part coupled to the body portion, the arm part moving to allow the substrate to be transferred; a suction part provided with the arm portion, the suction part suctioning and fixing the substrate; and a control part controlling an operation of the substrate transfer apparatus, wherein the control part changes a suction point on the substrate to re-attempt suction when suction of the substrate by the suction part is unsuccessful.

In some embodiments, the suction part may use a vacuum pressure to suction the substrate.

In other embodiments, the control part may control the arm part and allow the suction point to move a preset distance in a preset direction on the substrate.

In still other embodiments, the control part may allow suction to be re-attempted on a changed suction point when the suction is attempted on a same suction point a preset number of times but is unsuccessful.

In even other embodiments, the control part may move the arm part to allow a suction point to change from a center of the substrate to a second suction point obtained by moving a preset distance in a preset radial direction and allow the suction part to re-attempt suction, when the suction part attempts to suction a first suction point and the suction of the substrate is unsuccessful.

In yet other embodiments, the control part may move the arm part to allow the suction point to change from the center to a third suction point obtained by moving the preset distance in a direction opposite to the preset radial direction and allow the suction part to re-attempt suction, when the suction of the substrate at the second suction point is unsuccessful.

In further embodiments, the control part may move the arm part to allow the suction point to change from the center to a fourth suction point obtained by moving the preset distance in a direction orthogonal to the preset radial direction and allow the suction part to re-attempt suction, when the suction of the substrate at the third suction point is unsuccessful.

In still further embodiments, the control part may move the arm part to allow the suction point to change from the center to a fifth suction point obtained by moving the preset distance in a direction opposite to the orthogonal direction and allow the suction part to re-attempt suction, when the suction of the substrate at the fourth suction point is unsuccessful.

In even further embodiments, the distance may be set to allow a sum of a radius of the substrate and the distance to be smaller than half a width of a transfer section of the substrate.

In even further embodiments, the control part may be configured to: allocate a score to a corresponding suction point when the suction of the substrate is successful, and attempt to suction a plurality of suction points in an order of score.

In other embodiments of the present invention, methods of transferring a substrate by a substrate transfer apparatus include: moving an arm part to allow a suction part to be in contact with a suction point on the substrate; attempting to suction the substrate by the suction portion; moving the arm part to allow the suction point of the suction part on the substrate to change when the suction of the substrate is unsuccessful; and re-attempting the suction of the substrate by the suction portion.

In some embodiments, the moving of the arm part to allow the suction point of the suction part on the substrate to change may include moving the arm part to allow the suction point to move a preset distance in a preset direction on the substrate.

In other embodiments, the moving of the arm part to allow the suction point of the suction part on the substrate to change may include moving the arm part to allow the suction point of the suction part on the substrate to change when suction is attempted on a same suction point a preset number of times but is unsuccessful.

In still other embodiments, the moving of the arm part to allow the suction part to be in contact with the suction point may include moving the arm part to allow the suction part to be in contact with a first suction part that is a center of the substrate, and the moving of the arm part to allow the suction point of the suction part on the substrate to change may include moving the arm part to allow the suction point to change from the center to a second suction point obtained by moving a preset distance in a preset radial direction.

In even other embodiments, the method may further include: moving the arm part to allow the suction point to change from the center to a third suction point obtained by moving the preset distance in a direction opposite to the preset radial direction when the suction of the substrate at the second suction point is unsuccessful; and re-attempting the suction by the suction portion.

In yet other embodiments, the method may further include: moving the arm part to allow the suction point to change from the center to a fourth suction point obtained by moving the preset distance in a direction orthogonal to the preset radial direction when the suction of the substrate at the third suction point is unsuccessful; and re-attempting the suction by the suction portion.

In further embodiments, the method may further include: moving the arm part to allow the suction point to change from the center to a fifth suction point obtained by moving the preset distance in a direction opposite to the orthogonal direction when the suction of the substrate at the fourth suction point is unsuccessful; and re-attempting the suction by the suction portion.

In still further embodiments, the distance may be set to allow a sum of a radius of the substrate and the distance to be smaller than half a width of a transfer section of the substrate.

In even further embodiments, the method may further include: allocating a score to a corresponding suction point when the suction of the substrate is successful, and attempting to suction a plurality of suction points in an order of the score.

In even other embodiments of the present invention, substrate processing apparatuses include: a transfer chamber; a process chamber arranged on one side of the transfer chamber, the process chamber providing a space for processing the substrate; a loadlock chamber arranged on another side of the transfer chamber, the loadlock chamber providing a space for placing the substrate; a transfer unit provided in the transfer chamber, the transfer unit transferring the substrate between the loadlock chamber and the process chamber; and a control part controlling an operation of the substrate processing apparatus, the transfer unit including: a body portion; an arm part coupled to the body portion, the arm part moving to allow the substrate to be transferred; and a suction part provided with the arm portion, the suction part suctioning and fixing the substrate, wherein the control part changes a suction point on the substrate to re-attempt suction when suction of the substrate by the suction part is unsuccessful.

In yet other embodiments of the present invention, computer readable recording mediums on which a program to implement a substrate transfer method and to be executed by a computer is recorded are provided, the method including: to transfer a substrate by a substrate transfer apparatus, moving an arm part to allow a suction part to be in contact with a suction point on the substrate; attempting to suction the substrate by the suction portion; moving the arm part to allow the suction point of the suction part on the substrate to change when the suction of the substrate is unsuccessful; and re-attempting to suction the substrate by the suction portion.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Various embodiments of the present invention are described below in detail with reference to the accompanying drawings.

According to an embodiment of the present invention, a substrate processing apparatus having a cluster type structure is described, for example. The technical spirit of the present invention is, however, not limited thereto and a substrate transfer unit of the present invention may be applied various apparatuses.

According to an embodiment of the present invention, a substrate for fabricating a semiconductor chip is described as a target that is moved by the substrate transfer unit, for example. However, the target that is moved by the substrate transfer unit of the present invention is not limited to the substrate. For example, the target may include various plate-shaped substrates, such as a glass substrate.

Figure 1:
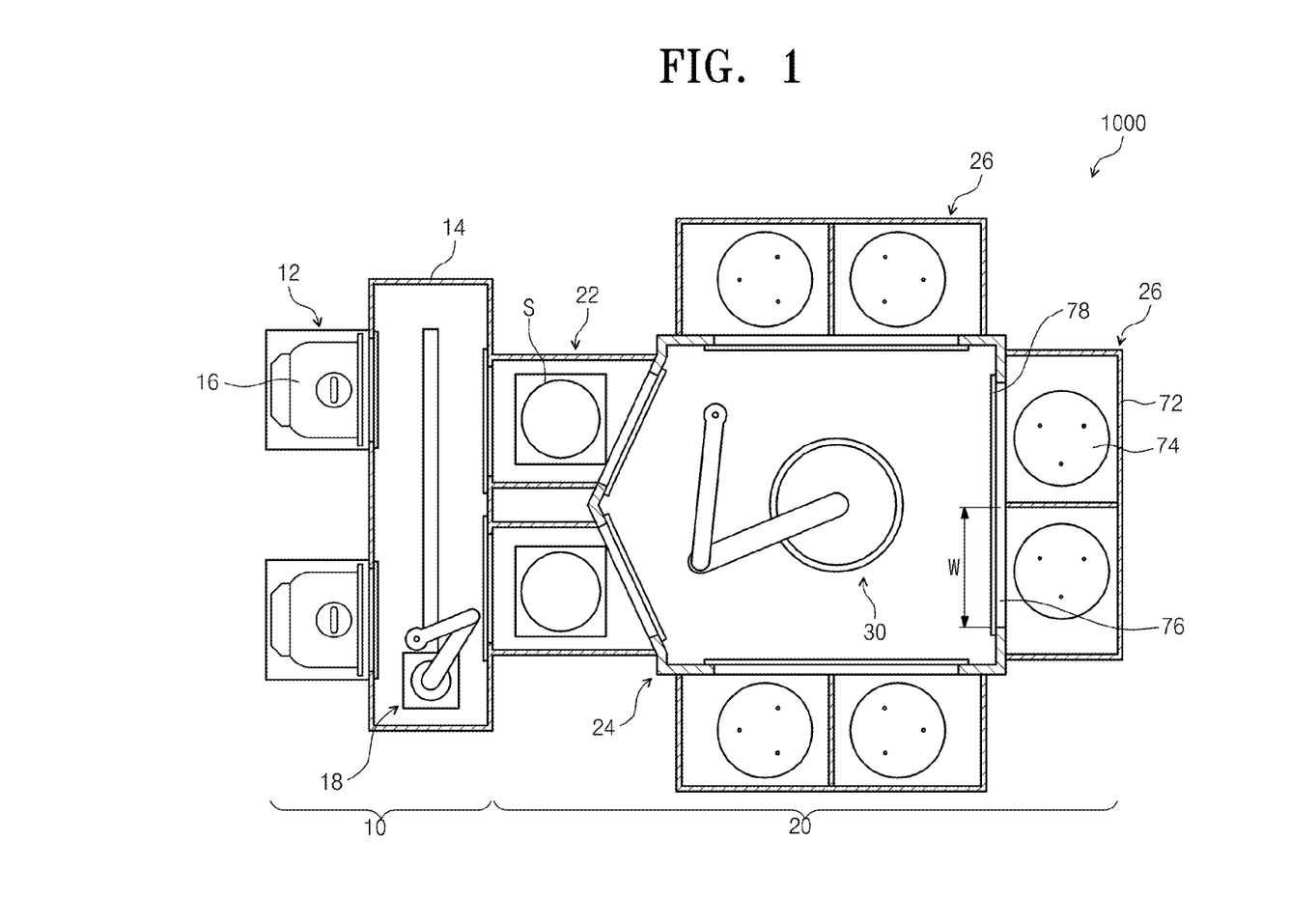
FIG. 1 is an exemplary, schematic, plan view of a substrate processing apparatus according to an embodiment of the present invention.

FIG. 1 is an exemplary, schematic, plan view of a substrate processing apparatus according to an embodiment of the present invention.

Referring to FIG. 1, a substrate processing apparatus 1000 has an equipment front-end module 10 and process equipment 20.

The equipment front-end module 10 is installed at the front of the process equipment 20 and transfers a substrate S between a container 16 holding the substrate S and the process equipment 20. The equipment front-end module 10 has a plurality of load ports 12 and a frame 14. The frame 14 is placed between the load ports 12 and the process equipment 20. The container 16 holding the substrate S is placed on the load ports 12 by a transfer unit (not shown) such as an overhead transfer unit, an overhead conveyor, or an automated guided vehicle. The container 16 may be a closed container such as a front open unified pod (FOUP). A frame robot 18 that transfers the substrate S between the container 16 placed on the load port 12 and the process equipment 20 is installed in the frame 14. A door opener (not shown) that automatically opens and closes the door of the container 16 may be installed in the frame 14. Also, a fan filter unit (not shown) that supplies clean air into the frame 14 may be provided with the frame 14 so that the clean air flows downwardly in the frame 14.

The process equipment 20 has a loadlock chamber 22, a transfer chamber 24, and a process chamber 26. The transfer chamber 24 may have a polygonal shape when viewed from the top. The loadlock chamber 22 or the process chamber 26 is placed on the side of the transfer chamber 24.

The loadlock chamber 22 is placed at a side adjacent to the equipment front-end module 10 among sides of the transfer chamber 24 and the process chamber 26 is placed at another side. One or more loadlock chambers 22 are provided.

According to an example, two loadlock chambers 22 are provided. Substrates S entering the process equipment 20 to perform a process temporarily may stay at one of the two loadlock chambers 22 and substrates S that are processed and exit the process equipment 20 may temporarily stay at the other. Alternatively, one or more loadlock chambers 22 may be provided and substrate loading and unloading operations may be performed in each of the loadlock chambers 22.

Substrates are placed to face one another at vertical intervals in the loadlock chamber 22. Slots 22a that support a part of the edge of the substrate may be provided with the loadlock chamber.

The transfer chamber 24 and the process chamber 26 are maintained in a vacuum state and the loadlock chamber 22 is switched between a vacuum state and an atmospheric state. The loadlock chamber 22 prevents an external polluted material from entering the transfer chamber 24 and the process chamber 26. A gate valve (not shown) is installed between the loadlock chamber 22 and the transfer chamber 24 and between the loadlock chamber 22 and the equipment front-end module 10. When the substrate S moves between the equipment front-end module 10 and the loadlock chamber 22, the gate valve between the loadlock chamber 22 and the transfer chamber 24 is closed, and when the substrate S moves between the loadlock chamber 22 and the transfer chamber 24, the gate valve between the loadlock chamber 22 and the equipment front-end module 10 is closed.

The process chamber 26 performs a certain process on the substrate S. For example, the process chamber 26 may be a chamber that performs an ashing, deposition, etching, measuring, etc. process. One or more process chambers 26 are provided on sides of the loadlock chamber 22. When a plurality of process chambers 26 are provided, each process chamber 26 may perform the same process on the substrate S. Optionally, when a plurality of process chambers 26 are provided, each process chamber 26 may perform the same process on the substrate S.

The process chamber 26 has a housing 72 and a support member 74. The housing 72 provides a space in which a process is performed. The support member 74 is provided in the housing 72 and supports the substrate S when a process is performed. The support member 74 may be provided with a structure that fixes the substrate S by mechanical clamping, or may be provided with a structure that fixes the substrate S by electrostatic force. An opening 76 through which the substrate S enters and exits is formed on a region that faces the transfer chamber 24 from among the external walls of the housing 72. The opening 76 may be opened and closed by a door 78. The opening 76 is provided to be equal in number to the housing 72 and the support member 74 and each opening 76 is provided with a width through which the substrate S may enter and exit. The number of support members 74 that is provided with the housing 72 may further increase.

The substrate transfer unit 30 is installed in the transfer chamber 24. The substrate transfer unit 30 transfers the substrate between the process chamber 26 and the loadlock chamber 22. Also, when a plurality of process chambers 26 is provided, the substrate transfer unit 30 may transfer the substrate S between the process chambers 26.

Figure 2:
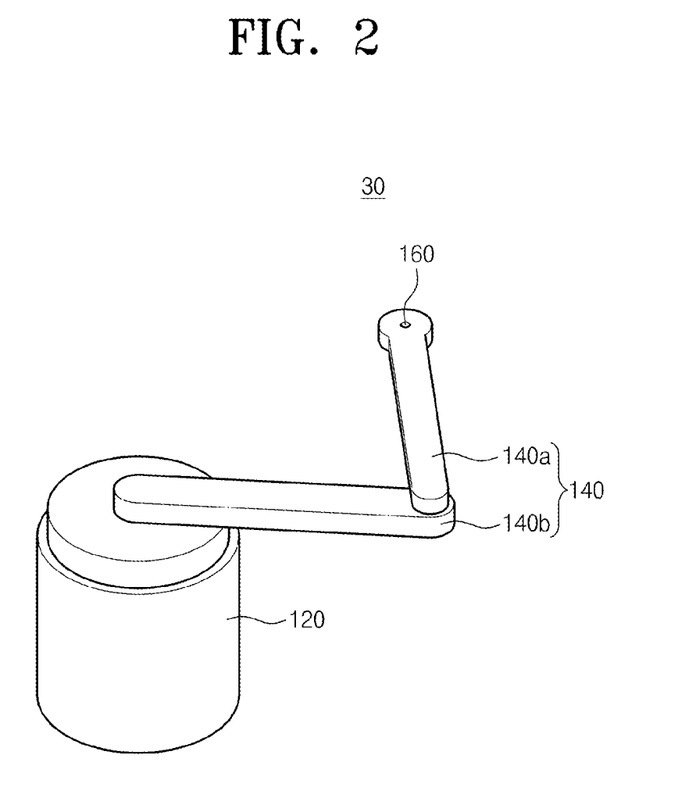
FIG. 2 is an exemplary, perspective view of a substrate transfer unit according to an embodiment of the present invention.

FIG. 2 is an exemplary, perspective view of the substrate transfer unit 30 according to an embodiment of the present invention.

Referring to FIG. 2, the substrate transfer unit 30 may include a body part 120, an arm part 140 and a suction part 160.

The body part 120 may be coupled to the arm part 140 to operate the arm part 140. As shown in FIG. 2, the body part 120 may have a cylindrical shape and be hollow. The body part 120 may contain members for operating the arm part 140, such as a motor, a pulley, or a belt but the shape and configuration of the body part 120 are not limited thereto.

The arm part 140 may be coupled to the body part 120 to transfer the substrate S.

According to an embodiment, the arm part 140 may be configured by the connection of a plurality of arms. For example, the arm part 140 may have a first arm 140a and a second arm 140b as shown in FIG. 2.

Each of the first and second arms 140a and 140b may have a rod shape, and an end of the first arm 140a may be coupled to an end of the second arm 140b so that the first arm may make a rotational motion with respect to the second arm 140b. The first and second arms 140a and 140b may contain members for operating the arms. The first arm 140a may make a rotational motion with respect to the body part 120 and also make a straight-line motion vertically in some embodiments.

The suction part 160 may be provided with the arm part 140, suction and fix the substrate to the arm part 140 to transfer the substrate. The suction part 160 may use a vacuum pressure to suction the substrate S.

Figure 3:
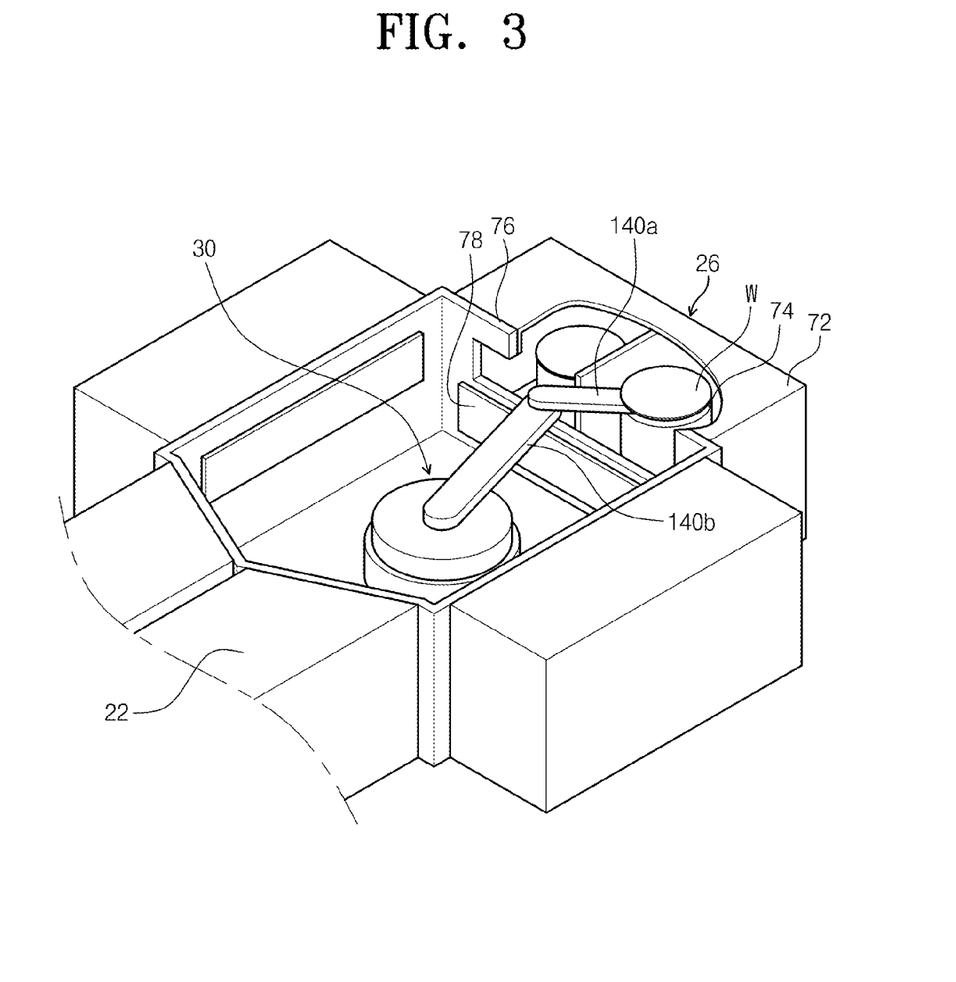
FIG. 3 is an exemplary, perspective view of how a substrate transfer unit according to an embodiment of the present invention suctions and fixes a substrate.

FIG. 3 is an exemplary, perspective view of how the substrate transfer unit according to an embodiment of the present invention suctions and fixes the substrate S.

As shown in FIG. 3, when the substrate S needs to be transferred, the arm part 140 may move toward the substrate S and the arm part 140 may move so that the suction part 160 is placed on a point of a surface of the substrate S, such as a bottom of the substrate.

Then, the suction part 160 may use a vacuum pressure to suction the substrate S. For example, a vacuum pump connected to the substrate transfer unit 30 decreases the internal pressure of a space formed by the substrate S and the suction part 160, so the substrate S may adhere to the suction part 160.

Although the substrate transfer unit 30 in FIG. 2 is shown that the suction part 160 has one suction hole, the configuration of the suction part may not be limited thereto and also have a plurality of suction holes.

The substrate processing apparatus 1000 may include a control part (not shown) that controls the operation of the substrate processing apparatus.

The control part may also control the operation of the substrate transfer unit 30 and according to an embodiment of the present invention, when the suction of the substrate by the suction part 160 is unsuccessful, the control part may control the substrate transfer unit 30 to change the suction point of the substrate S and re-attempt the suction.

For example, when the suction of the substrate is unsuccessful, the control part may control the arm part 140 so that the suction point moves so that the suction point moves a preset distance in a preset direction on the substrate S.

FIGS. 4 to 8 illustrate where the substrate transfer unit according to an embodiment of the present invention attempts to suction the substrate S.

Figure 4:
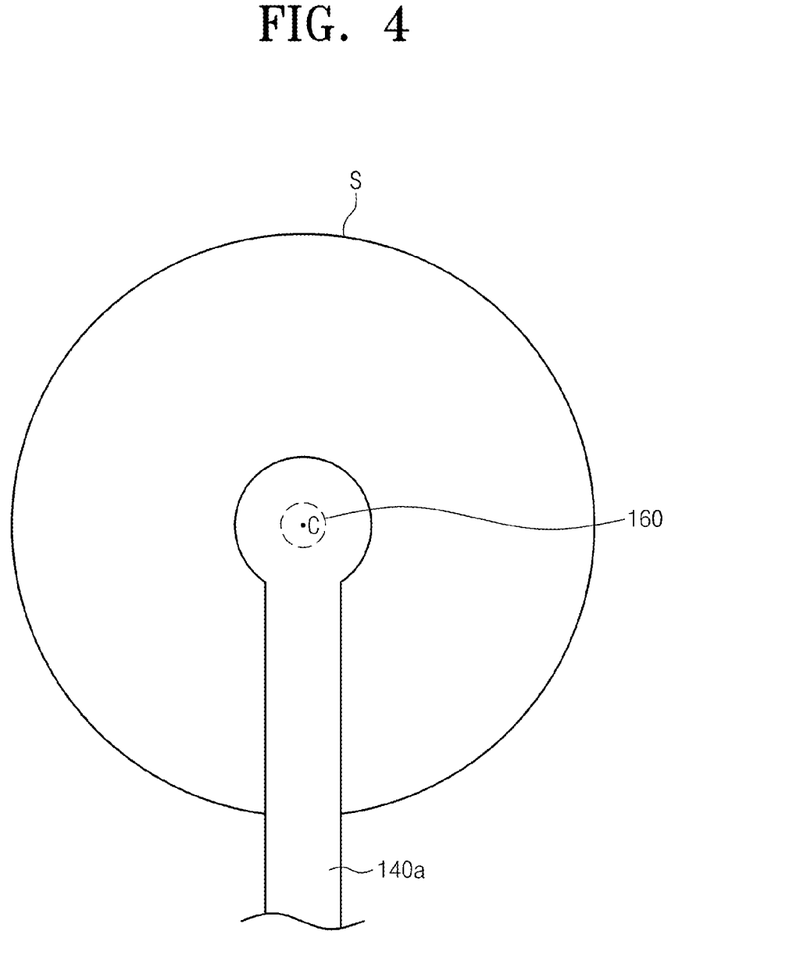
FIGS. 4 to 8 illustrate where a substrate transfer unit according to an embodiment of the present invention attempts to suction a substrate.

As shown in FIG. 4, when the substrate S needs to be transferred, the substrate transfer unit 30 may move the arm part 140 so that the suction part 160 is placed at a first suction point that is the center C of the substrate S.

When the suction part 160 is placed at the first suction point, the substrate transfer unit 30 may decrease the internal pressure of a space formed by the substrate S and the suction part 160 to attempt to suction the substrate S.

When the internal pressure decreases to be equal to or lower than a desired pressure, the substrate S may adhere normally to the suction part 160 and it may be determined that the suction is successful and the substrate transfer unit 30 may initiate the transfer of the substrate S.

However, when the internal pressure is not equal to or lower than a desired pressure, it may be determined that the suction is unsuccessful because the substrate S does not normally adhere to the suction part 160 and thus there is a risk of being separated upon transfer.

In this case, the substrate transfer unit 30 may move the arm part 140 so that the suction point moves a preset distance in a preset direction on the substrate S, change the suction point and then re-attempt to suction the substrate.

Figure 5:
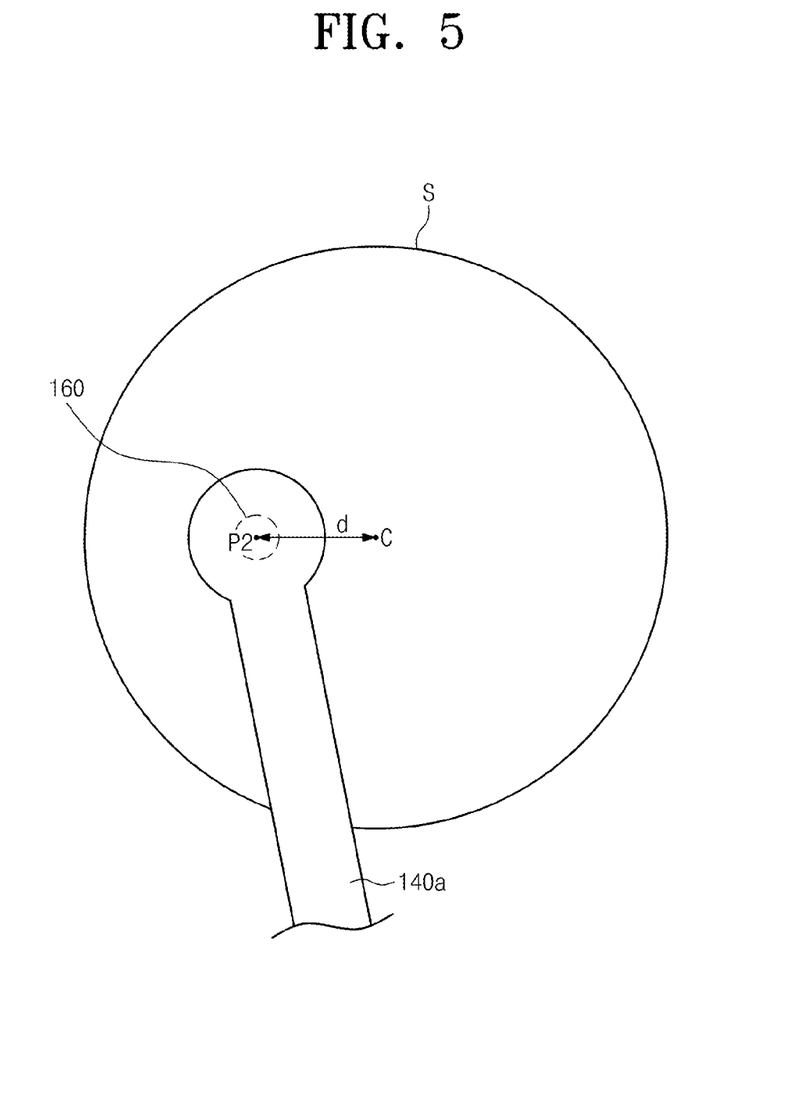

For example, when the suction of the substrate is unsuccessful, the substrate transfer unit 30 may move the arm part 140 so that the suction point changes from the center C of the substrate S to a second suction point P2 obtained by moving a preset distance d in a preset radial direction, such as leftward, and re-attempt the suction as shown in FIG. 5.

Figure 6:
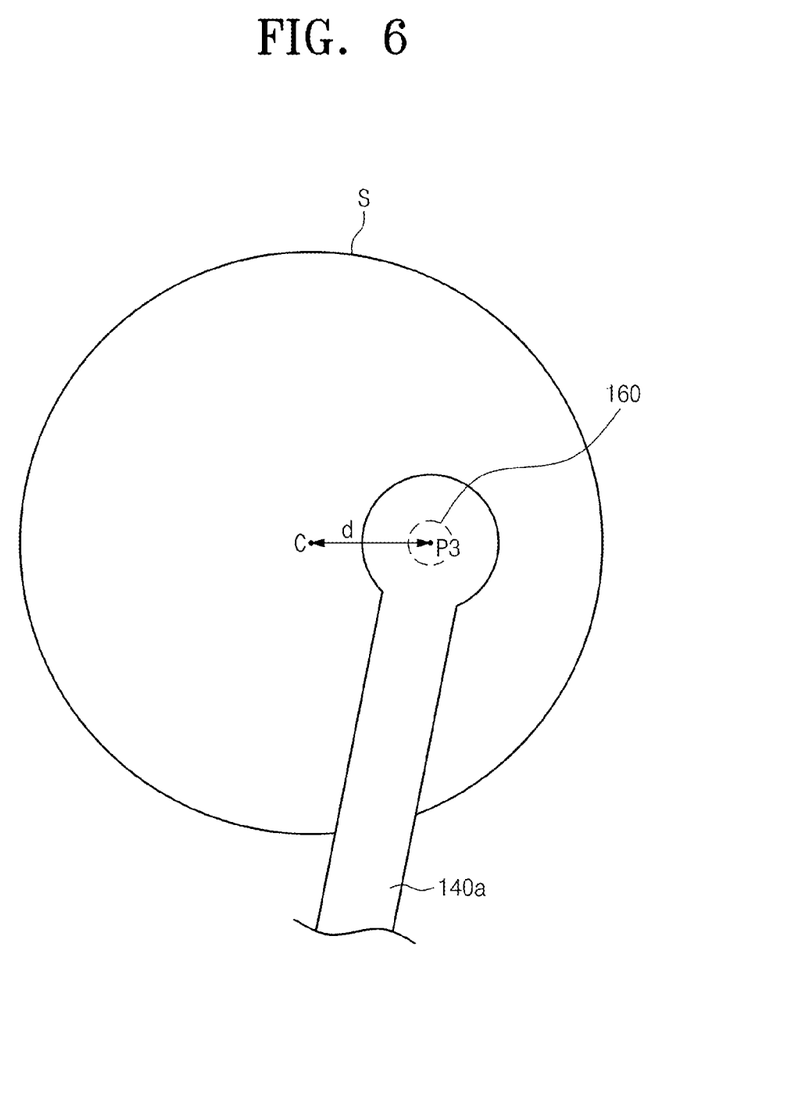

According to an embodiment, when the suction of the substrate at the second suction point P2 is also unsuccessful, the substrate transfer unit 30 may move the arm part 140 so that the suction point changes from the center C to a third suction point P3 obtained by moving the preset distance d in a direction opposite to the preset radial direction, such as rightward, and re-attempt the suction as shown in FIG. 6.

Figure 7:
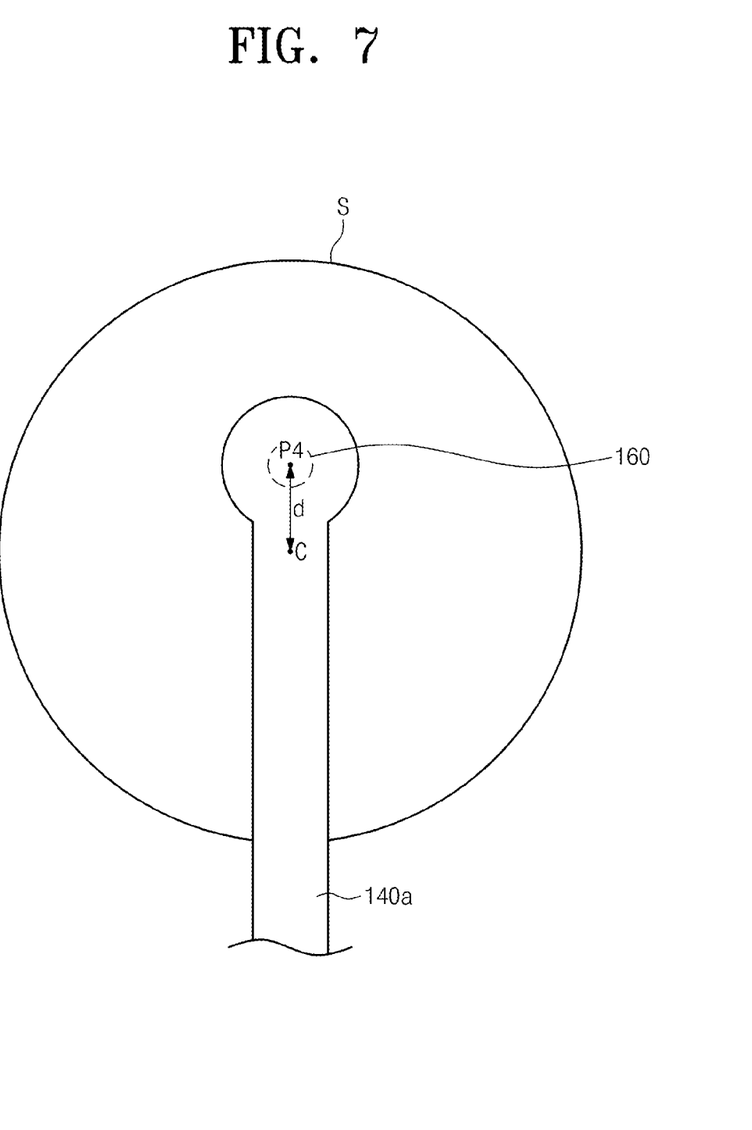

Then, when the suction of the substrate at the third suction point P3 is also unsuccessful, the substrate transfer unit 30 may move the arm part 140 so that the suction point changes from the center C to a fourth suction point P4 obtained by moving the preset distance d in a direction orthogonal to the preset radial direction, such as upwards, and re-attempt the suction as shown in FIG. 7.

Figure 8:
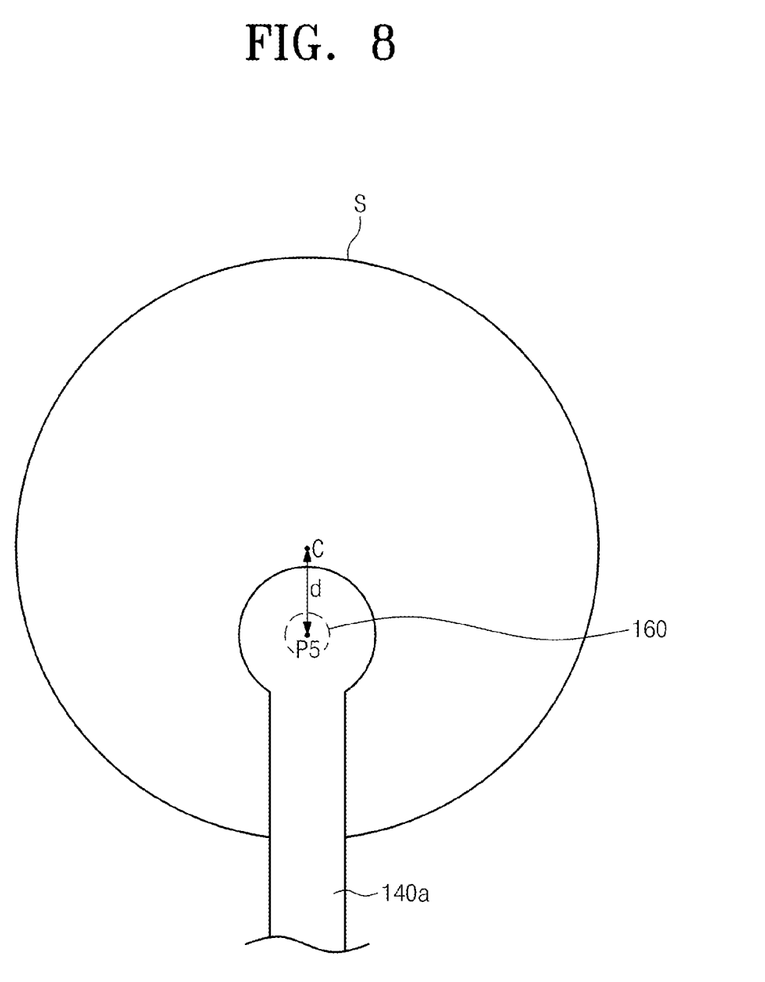

Then, when the suction of the substrate at the fourth suction point P4 is also unsuccessful, the substrate transfer unit 30 may move the arm part 140 so that the suction point changes from the center C to a fifth suction point P5 obtained by moving the preset distance d in a direction opposite to the orthogonal direction, such as downwards, and re-attempt the suction as shown in FIG. 8.

As described above, the substrate transfer unit 30 may change the suction point and re-attempt to suction the substrate, when the suction of the substrate S by the suction part 160 is unsuccessful.

Unlike FIGS. 5 to 8, the location of the suction point on the substrate S may vary depending on embodiments. For example, the suction point may also move on the substrate S in a diagonal direction instead of vertically or horizontally, and the moving distance d of the suction point may also vary depending on embodiments.

According to an embodiment, the moving distance d of the suction point may be set so that a sum of the radius of the substrate S and the distance d is smaller than half the width of the transfer section of the substrate S.

For example, referring to FIG. 1, the substrate S may be put and processed in the process chamber 26 and then exit the process chamber. In this case, the moving distance d of the suction point set for the substrate transfer unit 30 is set so that a sum of the moving distance and the radius of the substrate S is smaller than half the width w of the opening 76 that is the transfer section of the substrate S.

As a result, while the substrate is transferred, it is possible to prevent the substrate S from becoming damaged due to the collision with the housing 72 of the process chamber or separated from the transfer unit 30.

According to an embodiment, the substrate transfer unit 30 may attempt to suction the same suction point a preset number of times and when the suction of the substrate at a corresponding point is eventually unsuccessful, it is possible to change the suction point and re-attempt the suction.

For example, the substrate transfer unit 30 may attempt to suction the first suction point C in FIG. 4 a certain number of times, such as three times and when the suction of the substrate at the first suction point is eventually unsuccessful, it is possible to change the suction point to the second suction point P2 in FIG. 5 and attempt suction a certain number of times. The number of times suction is repetitively attempted at one point may be set to one or more depending on embodiments.

According to an embodiment of the present invention, the control part may allocate a score to a corresponding point when the suction of the substrate at one point is successful. Then, when the substrate needs to be transferred later, the substrate transfer unit 30 may attempt to suction a plurality of suction points in the order of the score.

For example, the substrate transfer unit 30 may attempt to first suction a point having the highest score among the first to fifth suction points, namely, a point at which the suction of the substrate is most frequently successful until now. Then, when the suction of the substrate at this point is unsuccessful, the substrate transfer unit 30 may attempt to suction a point have the second highest score.

As such, the substrate transfer unit 30 may recognize points having a high rate of suction success based on data on substrate suction success until now for a plurality of suction points. The score for the suction point may be stored in a storage unit such as a memory, and the control part may call data on the score from the storage unit and select an optimal suction point based on the data.

Figure 9:
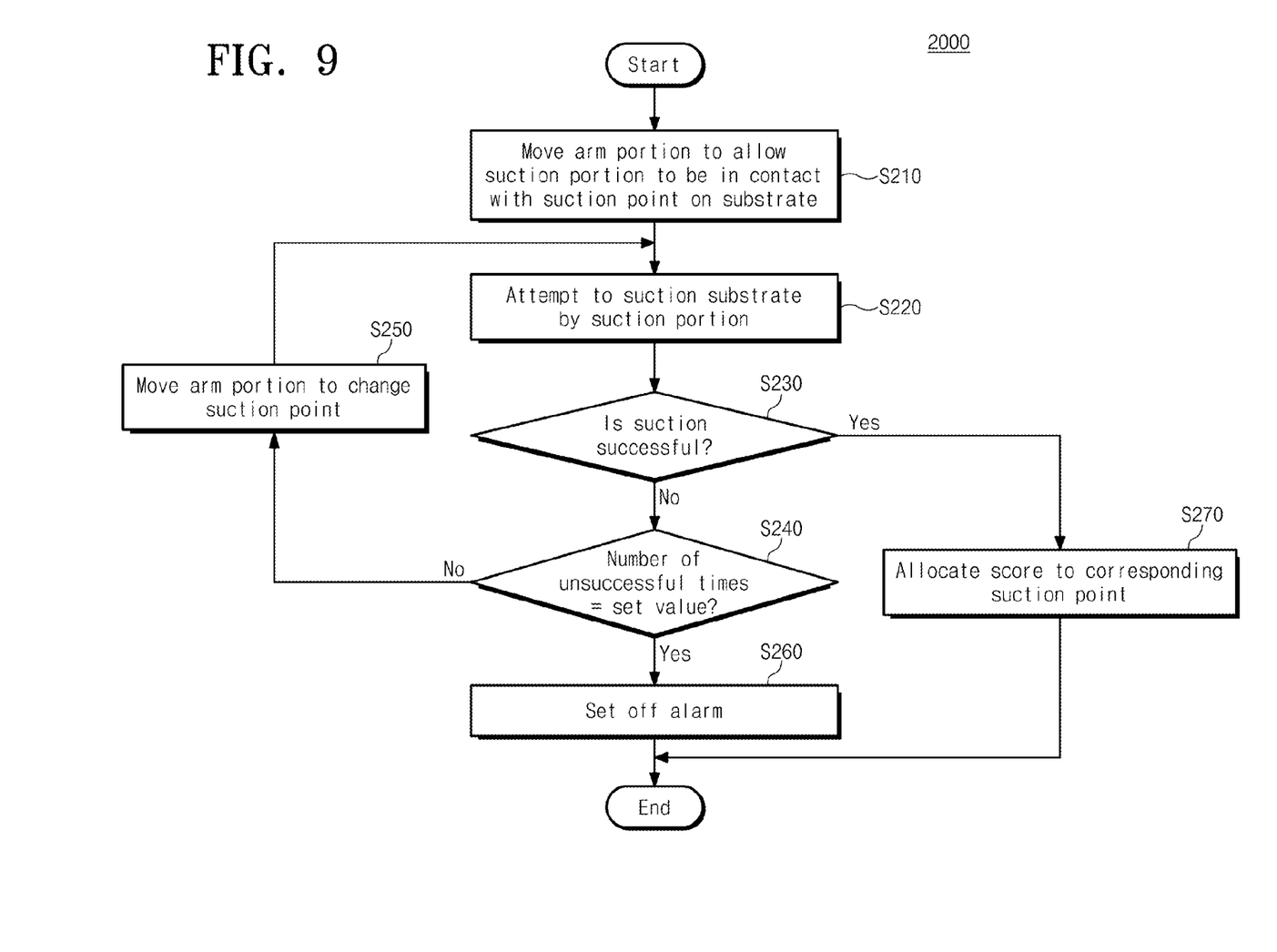
FIG. 9 is an exemplary flowchart of a substrate transfer method according to an embodiment of the present invention.

FIG. 9 is an exemplary flowchart of a substrate transfer method according to an embodiment of the present invention.

As shown in FIG. 9, a substrate transfer method 2000 may include moving the arm part 140 so that the suction part 160 is in contact with the suction point on the substrate S in step S210, attempting the suction of the substrate by the suction part 160 in step S220, changing the suction point on the substrate S for the suction part 160 in step S250 when the suction of the substrate is unsuccessful (No in step S230), and re-attempting the suction of the substrate by the suction part 160 in step S220.

The moving of the arm part 140 for changing the suction point in step S250 may include moving the arm part 140 so that the suction point moves a preset distance in a preset direction on the substrate S.

According to an embodiment, the moving of the arm part 140 for changing the suction point in step S250 may include moving the arm part 140 to change the suction point when suction is attempted a preset number of times on the same suction point but is unsuccessful.

According to an embodiment, when the suction of the substrate is repetitively unsuccessful, the substrate suction method 2000 may continue to change the suction point and re-attempt suction.

For example, the moving of the arm part for allowing the suction part 160 to be in contact with the suction point in step S210 may include moving the arm part 140 so that the suction part 160 is in contact with the first suction point that is the center C of the substrate S. In addition, the moving of the arm portion 140 for changing the suction point in step S250 may include moving the arm part 140 so that the suction point changes from the center C to the second suction point P2 obtained by moving the preset distance d in the preset radial direction.

Then, the substrate transfer method 2000 may further include, when the suction of the substrate at the second suction point P2 is unsuccessful, moving the arm part 140 so that the suction point changes from the center C to the third suction point P3 obtained by moving the preset distance d in the direction opposite to the preset radial direction, and re-attempting the suction by the suction part 160.

According to an embodiment, the substrate transfer method 2000 may further include, when the suction of the substrate at the third suction point P3 is unsuccessful, moving the arm part 140 so that the suction point changes from the center C to the fourth suction point P4 obtained by moving the preset distance d in the direction orthogonal to the preset radial direction, and re-attempting the suction by the suction part 160.

Also, the substrate transfer method 2000 may further include, when the suction of the substrate at the fourth suction point P4 is unsuccessful, moving the arm part 140 so that the suction point changes from the center C to the fifth suction point P5 obtained by moving the preset distance d in the direction opposite to the orthogonal direction, and re-attempting the suction by the suction part 160.

As such, the substrate transfer method 2000 may change the suction point and re-attempt the suction of the substrate around the first suction point, when the suction of the substrate at the first suction point is unsuccessful.

According to an embodiment, the distance d may be set so that a sum of the radius of the substrate S and the distance d is smaller than half the width w of the transfer section of the substrate S.

According to an embodiment of the present invention, the substrate transfer method 2000 may further include allocating a score to a corresponding suction point in step S270 when the suction of the substrate is successful (YES in step S230). In this case, the substrate transfer method 2000 may attempt to suction a plurality of suction points in the order of score and initiate suction on a point having a high success rate.

The substrate transfer method 2000 according to the above-described embodiment of the present invention may be produced as a program for being executed on a computer and be stored in a computer readable recording medium. The computer readable recording medium includes all kinds of storage devices storing data that may be read by a computer system. Examples of the computer readable recording medium are a ROM, a RAM, a CD-ROM, a magnetic tape, a floppy disk, and an optical data storage device.

According to an embodiment of the present invention, it is possible to lower the chance of a substrate processing process stopping by increasing the rate of success at which the substrate is suctioned.

According to an embodiment of the present invention, it is possible to enhance productivity by continuously operating an apparatus without stopping the substrate processing process.

Although the present invention is described above through embodiments, the embodiments above are only provided to describe the spirit of the present invention and not intended to limit the present invention. A person skilled in the art will understand that various modifications to the above-described embodiments may be made. The scope of the present invention is defined only by the following claims.

What is claimed is:

1. A substrate transfer apparatus comprising:
a body portion;
an arm part coupled to the body portion, the arm part moving to allow the substrate to be transferred;
a suction part provided with the arm portion, the suction part suctioning and fixing the substrate; and
a control part controlling an operation of the substrate transfer apparatus,
wherein the control part moves a suction point by a distance in a direction on the substrate to re-attempt suction when suction of the substrate by the suction part is unsuccessful.

2. The substrate transfer apparatus of claim 1, wherein the suction part uses a vacuum pressure to suction the substrate.

3. The substrate transfer apparatus of claim 1, wherein the control part controls the arm part and allows the suction point to move the distance in the direction on the substrate.

4. The substrate transfer apparatus of claim 1, wherein the control part allows suction to be re-attempted on a changed suction point when the suction is attempted on a same suction point a preset number of times but is unsuccessful.

5. The substrate transfer apparatus of claim 1, wherein the control part moves the arm part to allow a suction point to change from a center of the substrate to a second suction point obtained by moving the distance in a preset radial direction and allows the suction part to re-attempt suction, when the suction part attempts to suction a first suction point and the suction of the substrate is unsuccessful.

6. The substrate transfer apparatus of claim 5, wherein the control part moves the arm part to allow the suction point to change from the center to a third suction point obtained by moving the distance in a direction opposite to the preset radial direction and allows the suction part to re-attempt suction, when the suction of the substrate at the second suction point is unsuccessful.

7. The substrate transfer apparatus of claim 6, wherein the control part moves the arm part to allow the suction point to change from the center to a fourth suction point obtained by moving the distance in a direction orthogonal to the preset radial direction and allows the suction part to re-attempt suction, when the suction of the substrate at the third suction point is unsuccessful.

8. The substrate transfer apparatus of claim 7, wherein the control part moves the arm part to allow the suction point to change from the center to a fifth suction point obtained by moving the distance in a direction opposite to the orthogonal direction and allows the suction part to re-attempt suction, when the suction of the substrate at the fourth suction point is unsuccessful.

9. The substrate transfer apparatus of claim 5, wherein the distance is set to allow a sum of a radius of the substrate and the distance to be smaller than half a width of a transfer section of the substrate.

10. The substrate transfer apparatus of claim 8, wherein the control part is configured to:
allocate a score to a corresponding suction point when the suction of the substrate is successful, and
attempt to suction a plurality of suction points in an order of score.

11. A method of transferring a substrate by a substrate transfer apparatus, the method comprising:
moving an arm part to allow a suction part to be in contact with a suction point on the substrate;
attempting to suction the substrate by the suction portion;
moving the arm part to allow the suction point of the suction part on the substrate to move by a distance in a direction when the suction of the substrate is unsuccessful; and
re-attempting the suction of the substrate by the suction portion.

12. The method of claim 11, wherein the moving of the arm part to allow the suction point of the suction part on the substrate to change comprises moving the arm part to allow the suction point to move the distance in the direction on the substrate.

13. The method of claim 11, wherein the moving of the arm part to allow the suction point of the suction part on the substrate to change comprises moving the arm part to allow the suction point of the suction part on the substrate to change when suction is attempted on a same suction point a preset number of times but is unsuccessful.

14. The method of claim 11, wherein the moving of the arm part to allow the suction part to be in contact with the suction point comprises moving the arm part to allow the suction part to be in contact with a first suction part that is a center of the substrate, and the moving of the arm part to allow the suction point of the suction part on the substrate to change comprises moving the arm part to allow the suction point to change from the center to a second suction point obtained by moving the distance in a preset radial direction.

15. The method of claim 14, further comprising:
moving the arm part to allow the suction point to change from the center to a third suction point obtained by moving the distance in a direction opposite to the preset radial direction when the suction of the substrate at the second suction point is unsuccessful; and
re-attempting the suction by the suction portion.

16. The method of claim 15, further comprising:
moving the arm part to allow the suction point to change from the center to a fourth suction point obtained by moving the distance in a direction orthogonal to the preset radial direction when the suction of the substrate at the third suction point is unsuccessful; and
re-attempting the suction by the suction portion.

17. The method of claim 16, further comprising:
moving the arm part to allow the suction point to change from the center to a fifth suction point obtained by moving the distance in a direction opposite to the orthogonal direction when the suction of the substrate at the fourth suction point is unsuccessful; and
re-attempting the suction by the suction portion.

18. The method of claim 14, wherein the distance is set to allow a sum of a radius of the substrate and the distance to be smaller than half a width of a transfer section of the substrate.

19. The method of claim 11, further comprising:
allocating a score to a corresponding suction point when the suction of the substrate is successful, and
attempting to suction a plurality of suction points in an order of the score.

20. A substrate processing apparatus comprising:
a transfer chamber;
a process chamber arranged on one side of the transfer chamber, the process chamber providing a space for processing the substrate;
a loadlock chamber arranged on another side of the transfer chamber, the loadlock chamber providing a space for placing the substrate;
a transfer unit provided in the transfer chamber, the transfer unit transferring the substrate between the loadlock chamber and the process chamber; and
a control part controlling an operation of the substrate processing apparatus, the transfer unit comprising:
a body portion;
an arm part coupled to the body portion, the arm part moving to allow the substrate to be transferred; and
a suction part provided with the arm portion, the suction part suctioning and fixing the substrate,
wherein the control part moves a suction point by a distance in a direction on the substrate to reattempt suction when suction of the substrate by the suction part is unsuccessful.

* * * * *